United States Patent [19]

Kuo et al.

[11] Patent Number: 5,053,722
[45] Date of Patent: Oct. 1, 1991

[54] FAULT-TOLERANT, WIDEBAND RADAR MICROWAVE SIGNAL GENERATOR

[75] Inventors: Timothy E. Kuo, Torrance; Paula I. Tanaka, Lawndale; Stephen D. Taylor, Agoura, all of Calif.

[73] Assignee: Hughes Aircraft Company, Los Angeles, Calif.

[21] Appl. No.: 633,648

[22] Filed: Dec. 20, 1990

[51] Int. Cl.⁵ .............................................. H03L 7/00
[52] U.S. Cl. .......................................... 331/2; 331/25; 455/76
[58] Field of Search .................... 331/2, 18, 19, 25, 49, 331/56; 455/75, 76

[56] References Cited

U.S. PATENT DOCUMENTS

| | | | |
|---|---|---|---|
| 4,194,151 | 3/1980 | Gregersen et al. | 331/2 X |
| 4,272,730 | 6/1981 | Digiovanni | 331/25 X |
| 4,528,522 | 7/1985 | Matsuura | 331/2 |
| 4,864,634 | 9/1989 | Nakagawa et al. | 331/2 X |

Primary Examiner—Robert J. Pascal
Attorney, Agent, or Firm—Leonard A. Alkov; Wanda K. Denson-Low

[57] ABSTRACT

A wideband frequency synthesized, fault-tolerant microwave signal generator is described, which can generate the spectrally pure transmitter or antenna drive and receiver first local oscillator (LO) signals needed for advanced tactical airborne radar systems. Separate generation of the transmitter drive (TD) and first LO minimizes spurious signal generation over a wide operating band, typically 45% or greater. Extensive fault tolerance is provided without resort to redundant hardware. The sharing of two internal signal generators limits the frequency generation needs to just the operating band for economy of required hardware.

16 Claims, 3 Drawing Sheets

FAULT-TOLERANT, WIDEBAND RADAR MICROWAVE SIGNAL GENERATOR

BACKGROUND OF THE INVENTION

The present invention relates to signal generators used in radar systems.

Signal generators that are used to produce transmitter drive and receiver local oscillator (LO) signals for tactical airborne radar systems are unique in the severity of the requirements placed on them for frequency stability, spectral purity, frequency agility, operating bandwidth, and small packaged volume. Prior techniques could generally optimize performance in one or more of these areas but at the expense of performance compromises in other areas. For example, a generator might provide increased band coverage but at the expense of increased spurious signal levels or increased hardware complexity and volume.

Prior techniques for generating the high quality signals needed for radar application have generally been compromises of optimizing some performance parameters at the expense of less performance for others. A common prior technique uses either a frequency comb generator or a programmable harmonic phase locked loop to provide coarse, approximately 100 MHz step size, frequency control across the operating band. A second phase locked loop that employs a frequency offsetting mixer is used to combine that coarse frequency control with fine step frequency selection provided by either a bank of crystal reference oscillators or a UHF or L-band frequency synthesizer. The resulting signal functions as the receiver first LO and as the reference to a second mixer. That mixer, which is also driven by a fixed frequency signal at the receiver first intermediate frequency (IF), produces the transmitter drive (TD) signal with desired offset from the first LO. This signal generation technique has provided excellent performance for narrow (less than 10 percent) operating bandwidths. For wider band operation, however, spurious signal control of the TD upconverting mixer becomes unmanageable and regions in the band must be designated as unsuitable for radar operation. The complete separation of the functions of coarse frequency generation, fine frequency generation, combining of the coarse and fine frequency control, and TD frequency offsetting facilitates function optimizations but results in a volume consuming design that is not compatible with most next generation applications. Finally, fault-tolerance, which can only be provided by duplication of the hardware, is generally not feasible from volume considerations.

Other techniques of frequency generation include indirect frequency synthesis, direct frequency synthesis, and direct digital frequency synthesis. Any one of these techniques could, in principle, be used to separately generate the TD and first LO and avoid the use of a TD offset mixer and its associated spurious signal problems. Unfortunately, each of these approaches, when used alone, suffers from one or more shortcomings.

Indirect frequency synthesis is accomplished using a phase locked loop with wide range frequency dividers in the reference and the feedback signal paths to control the output frequency. Although relatively simple, divider noise severely restricts their use in a radar application.

Direct frequency synthesis uses an arrangement of mixers, frequency dividers, frequency multipliers, and filters to derive desired output frequencies from arithmetic combinations of one or more reference frequencies. These synthesizers can provide extremely fast switching but are generally very volume consuming when a large number of channels are required.

Direct digital frequency synthesis techniques employ a digital sine/cosine look-up table memory, suitable high speed control, clocking, and memory addressing circuitry, and a D/A converter to directly construct frequency programmable sine and cosine voltage waveforms. These frequencies are upconverted to the desired operating band by conventional analog techniques. This technique is extremely powerful in its ability to generate closely spaced channel frequencies and to simultaneously impose modulations but is limited with today's technology to poor spurious signal and FM noise performance.

None of the above approaches to radar signal generation offer as clean a way of generating both the TD and the first LO over a wide operating band as the hybrid approach of the present invention. Additionally, none provide the inherent fault-tolerance of the invention, a feature that is believed to be unique for the radar microwave signal generation function.

SUMMARY OF THE INVENTION

A wide-band microwave signal generator for active radars is disclosed, characterized in that separate transmit drive (TD) and receiver local oscillator (LO) signals are separately generated from a single reference oscillator. The signal generator comprises a stable reference oscillator for generating a reference signal at a reference frequency. A low band frequency generator is responsive to the reference signal for synthesizing a first low band output signal which is programmable over a first low frequency band comprising a wide frequency band of operation.

A high band frequency generator is responsive to the reference signal for synthesizing a first high band output signal which is programmable over a first relatively high frequency band comprising the wide frequency band.

The signal generator further includes a TD selection means for selecting the first low band generator output signal or the first high band output signal as the radar TD signal, and LO selection means for selecting the first low band generator output signal or the first high band generator output signal as the receiver LO signal. Thus, the first low band generator output signal is selected as the LO signal when the first high band generator output signal is selected as the TD signal, and the first high band generator output signal is selected as the LO signal when the first low band generator output signal is selected as the TD signal.

In the preferred embodiment, the transmitter drive and LO selection means comprise respective microwave switches.

The architectures of the low and high band generators are similar, and each comprises a programmable harmonic phase lock loop (PLL) responsive to the reference signal, closed around a harmonic phase comparator, a voltage controlled oscillator (VCO) and an offset signal mixer for mixing the VCO signal with an offset signal, the output of the mixer comprising a microwave signal fed back to the harmonic phase comparator for comparison with the reference signal, wherein the PLL may be programmably locked to an offset from a harmonic of the reference signal, the offset being determined by the frequency of the offset signal to be used as the mixer offset signal.

According to one aspect of the invention, the signal generator further comprises a frequency synthesizer for synthesizing a fine frequency control offset signal from said reference signal.

In accordance with another aspect of the invention, a fault tolerant back up mode of operation is provided. A frequency multiplier responsive to the reference signal for generates a second frequency offset signal at the first receiver IF. Means are included for selecting either the fine frequency offset signal provided by the programmable synthesizer or the second frequency offset signal to be mixed with the VCO output at the mixer of both the low and high frequency band generators. The fine offset signal is selected during a primary mode of operation, and the second offset signal being selected during a back-up mode of operation, thereby providing fault tolerance in the event of a synthesizer fault or of a high or low band generator failure, as will subsequently be made apparent. During the primary mode of operation, the first generator output signal can act as one of the TD or LO signals, and during the back-up mode of operation, the first and second generator outputs can be used as said TD and LO signals.

The new signal generator architecture does not use the frequency mixing upconverters that are typical of current systems to derive the transmitter drive (TD) from the first local oscillator (LO). For acceptable spurious signal levels, the mixer upconverter is generally limited to an output band of approximately 10 percent. Instead, the new generator separately synthesizes the TD and first LO, allowing the separate optimization of phase noise and spurious signal levels for the two signals and extension of the band coverage to 45 percent or beyond.

Most significantly, an estimated 90 percent fault-tolerance to single point failures is provided for the TD and first LO signal generation functions with very little additional hardware over that required for the primary functions; a feature that is believed to be unique for analog functions of this nature. In the event of a failure to either of the major microwave signal generators or to an L-band frequency synthesizer that provides fine step frequency control, the exciter source can be readily reconfigured to allow the remaining microwave generator to generate both the TD and the first LO over a 10 percent band with a plurality of spaced channels that provide full radar-quality operation.

BRIEF DESCRIPTION OF THE DRAWING

These and other features and advantages of the present invention will become more apparent from the following detailed description of an exemplary embodiment thereof, as illustrated in the accompanying drawings, in which.

FIG. is a simplified block diagram of a fault-tolerant, wideband exciter signal source embodying the invention.

DETAILED DESCRIPTION OF THE PREFERRED EMBODIMENT

Block Diagram of Fault-Tolerant, Wideband Signal Generator

Figure 1:
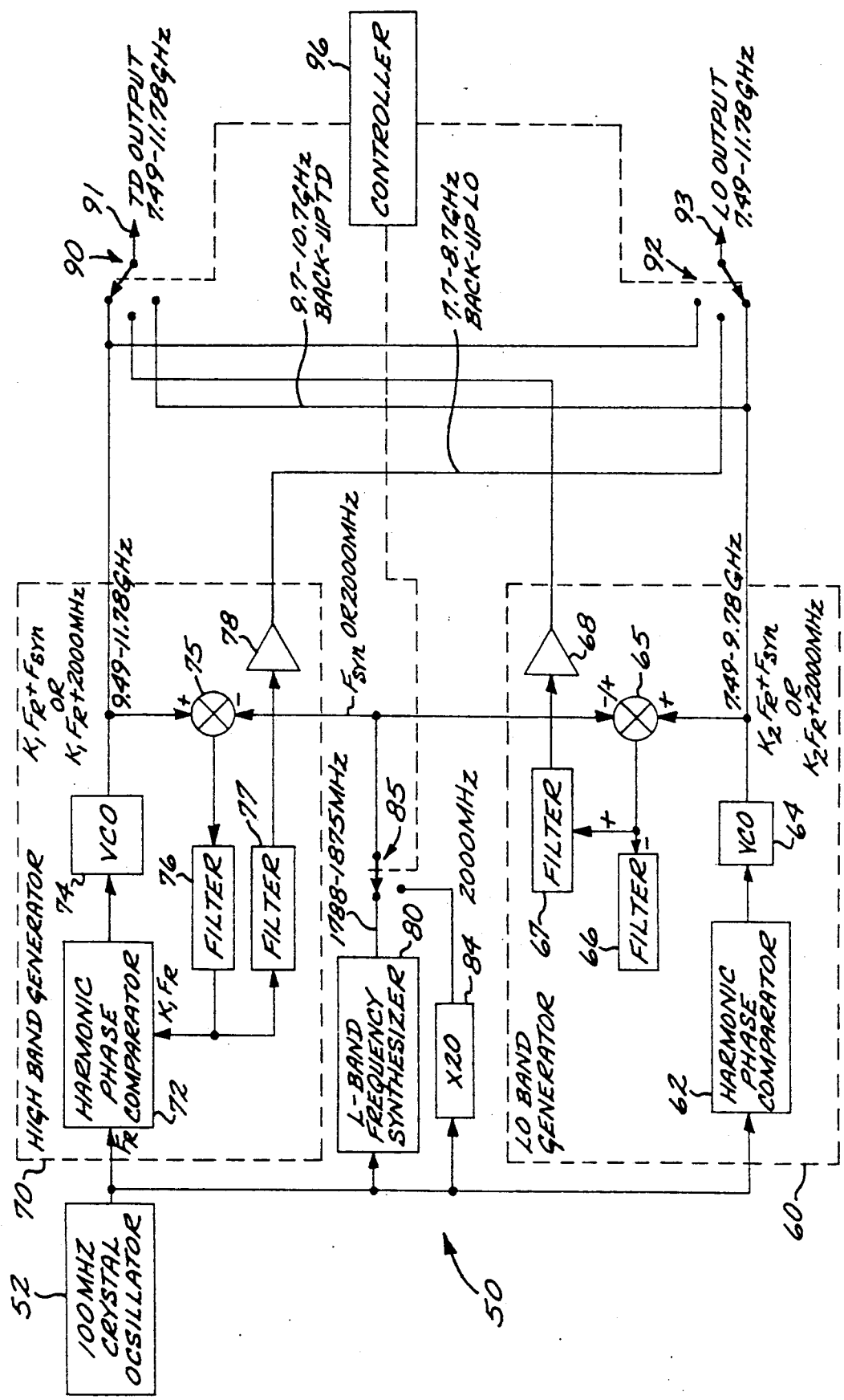

A simplified block diagram of a fault-tolerant, wideband exciter signal generator 50 embodying the invention is shown in FIG. 1. A single crystal oscillator 52 supplies the reference frequency $F_R$ of the entire generator, which greatly eases the control of spurious signal generations. The use of a single reference oscillator also facilitates the use of other reference source types for special applications, such as an ultra stable atomic reference for a bistatic radar application. The reference oscillator 52 generates a reference signal $F_R$, 100 MHz for the exemplary signal generator described herein, which drives in parallel the three major exciter signal source functions, low band generation, high band generation, and L-band frequency synthesis.

The low and high band generators 60 and 70 of FIG. 1 provide coverage of bands extending from approximately 7.5 to 9.8 GHz and from 9.5 to 1.8 GHz, respectively, in this embodiment. The generators 60 and 70 are architecturally similar, with each including a harmonic phase locked loop that is locked to a programmable harmonic ($K_1$ in the case of generator 70, $K_2$ in the case of generator 60) of the 100 MHz reference. Programming the harmonic lock ratio while holding the L-band synthesizer 80 frequency fixed produces output frequency changes in 100 MHz steps.

The harmonic phase locked loop of the low band generator 60 comprises the harmonic phase comparator 62, the voltage controlled oscillator (VCO) 64, the mixer 65 and filter 66. The phase comparator 60 generates an output voltage indicative of the phase difference between the reference signal from oscillator 52 and the loop signal from filter 66. This output voltage controls the VCO 64. The mixer 65 mixes the VCO signal with the output $F_{syn}$ from the L-band frequency synthesizer 80 or the output from the "x20" frequency multiplier 84.

In a similar fashion, phase locked loop of the high band generator 70 comprises harmonic phase comparator 72, VCO 74, mixer 75, and loop filter 76.

Figure 2:
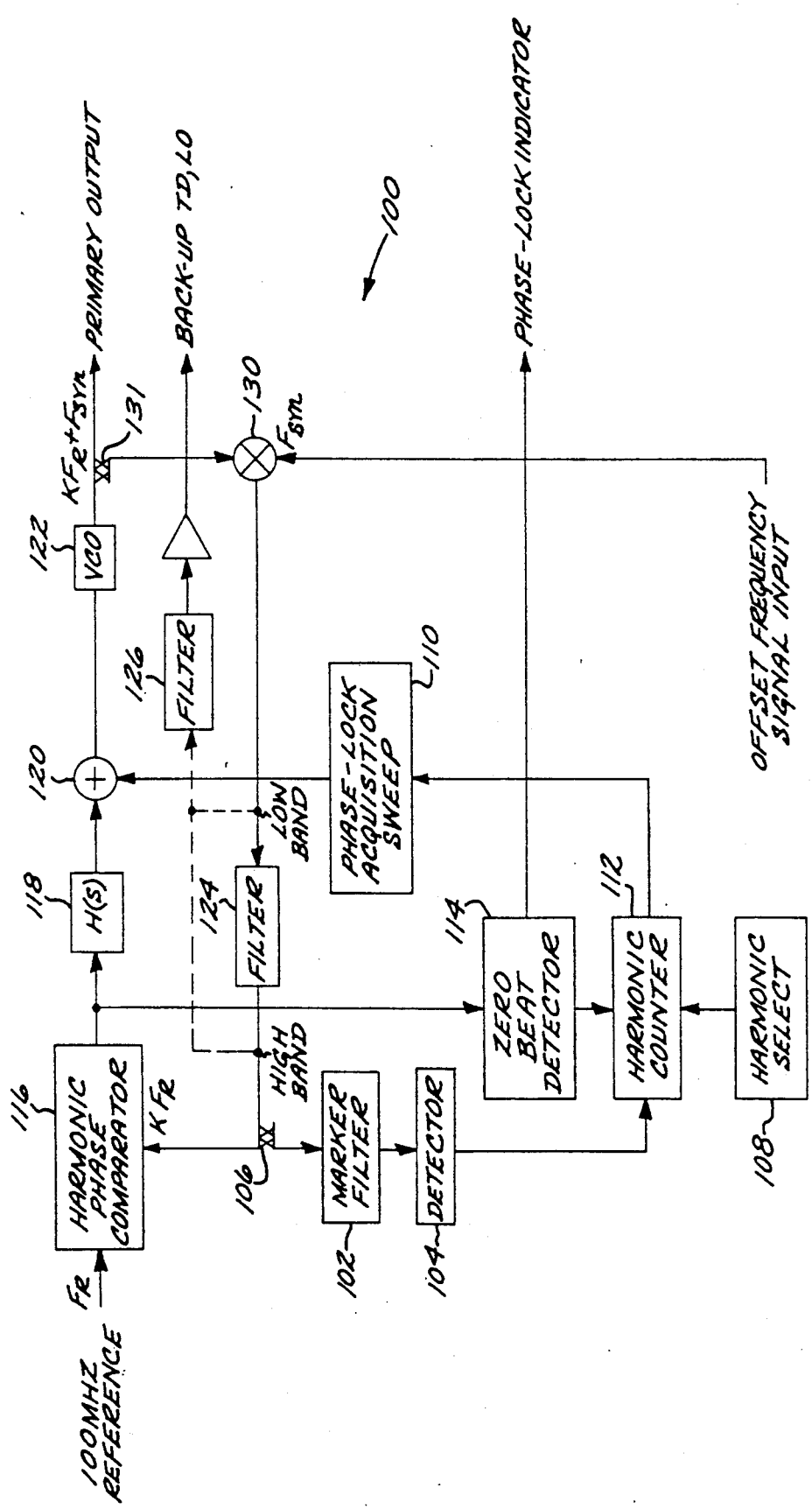
FIG. 2 is a block diagram of the low and high band generators comprising the signal source of FIG. 1.

The second input to each generator 60 and 70 is supplied by the L-band frequency synthesizer 80 which provides fine step frequency control in 12.5 MHz (one-eighth the 100 MHz coarse step) steps. The fine and coarse step frequency control of the generators 60 and 70 is combined within the harmonic phase locked loop by the respective mixers 65 and 75 in the loop feedback path. A more detailed description of the low and high band generators and the means by which the harmonic lock ratio is selected and controlled is given below. The particular implementation of the L-band frequency synthesizer is not an aspect of this invention per se, and can take any form that will provide the levels of performance needed for a particular application. One L-band frequency generator is shown in FIG. 2 of pending application Ser. No. 07/455,675, filed Dec. 22, 1989, by S. D. Taylor and P. I. Tanaka, having a common assignee with the present invention and now U.S. Pat. No. 5,015,971 issued May 14, 1991. The entire contents of this pending application are incorporated herein by this reference.

In operation, one of the generators 60 or 70 is selected to supply the TD and the other the first LO. A constant TD—first LO offset frequency is achieved by maintaining a constant difference in the programmed harmonic lock ratios ($K_2$, $K_1$) of the two generators 60 and 70. For this exemplary exciter source, that difference between $K_2$ and $K_1$ is 20 and results in an offset of $20 \times 100$ MHz or 2000 MHz; this offset is equal to the radar receiver first IF.

Two triple throw, single pole microwave output switches 90 and 92 are used to control generator output signal routing between the TD and first LO ports 91 and 93. When operating in the 7.5 to 9.6 GHz portion of the band, the low band generator 60 is selected to supply the TD signal and the high band generator 70 the first LO, 2000 MHz above the TD frequency. When operating in the 9.6 to 11.8 GHz portion of the band, the high band generator 70 is selected to supply the TD signal and the low band generator 60 the first LO, 2000 MHz below the TD frequency. The controller 96 provides control signals which control the settings of the switches 90 and 92. The receive signal spectrum inversion produced by switching the signal about the LO can be easily accommodated in the radar signal processing. A common means of synchronous radar target signal detection employs two mixers that are driven in common by the target signal but that have LO signals that are shifted in phase by 90 degrees with respect to each other. The frequency of those LOs is typically equal to the nominal target receive signal at the mixer inputs so that the outputs from the mixer are nominally at DC. This detection technique is commonly called in-phase and quadrature (I/Q) detection and produces the in-phase (I) and quadrature (Q) signal components as outputs. In modern systems, these analog signals are sampled at regular intervals and converted to digital data for inputs to a digital signal processor. The I/Q detection process enables the unambiguous resolution of target signal frequencies that are either above or below the I/Q detector LO frequency as would result from doppler frequency offsets for approaching targets versus receding targets. Without correction, the spectrum inversion mentioned above would result in the misinterpretation of approaching targets as receding targets and visa versa. A correction for this effect is simply obtained by interchanging the I and Q data in the radar processing of target returns when operating in the half of the operating band where the spectrum inversion has occurred. This interchange could be provided either by analog switches to reroute the I and Q signals or, more preferably, by software means in the radar digital processor to interchange I and Q digital data in the processing algorithms.

A key feature of the architecture of the low and high band generators 60 and 70 of the signal generator 50 is that, in addition to providing their primary outputs over their respective 2 GHz bands, they are also each able to generate both the TD and the first LO over the 9.7 to 10.7 GHz band. Most significantly, this fault-tolerance is provided with very little added hardware. That additional hardware consists only of the X20 frequency multiplier 84, the switch 85, the two filters 67 and 77, and the two microwave amplifiers 68 and 78 needed to bring out the back-up signals from the mixers 65 and 75, and a minimal amount of additional control logic circuitry that would be included in the controller 96 to set switches 85, 90, and 92 to select the back-up mode of operation.

To accomplish the back-up mode of operation, the output of the frequency synthesizer 80 is replaced with a fixed frequency equal to the receiver first IF (at 20 times the reference frequency) by operation of the double throw single pole microwave switch 85 controlled by the controller 96. This signal is supplied by the X20 frequency multiplier 84. With that signal applied, the respective frequency offsetting mixers 65 and 75 in the harmonic phase locked loop function to generate the TD signal from the first LO signal in the low band generator 60 and the first LO signal from the TD signal in the high band generator 70. The output of the mixer 65 of the low band generator 60 is applied to the respective bandpass filters 66 and 67. Filter 66 is tuned to the lower sideband of the mixer output, i.e., the VCO output frequency minus the offset signal frequency; in this embodiment, the passband is in the range of 5.5–7.8 Ghz. The filter 67, on the other hand, is tuned to the upper sideband of the mixer output, i.e., the VCO output frequency plus the offset signal frequency. The output of filter 67 is amplified by amplifier 68, and the amplifier output signal serves as the back-up mode TD signal which can be selected by the TD output selector switch 90.

The output of the mixer 75 of the high band generator 70 is applied to the filter 76. The passband of filter 76 is tuned to the lower sideband of the mixer output, i.e. the frequency of the VCO 74 output minus the offset signal frequency. The output of the filter 76 is applied to the harmonic phase comparator 72 and to another passband filter 77. The passband of filter 77 may be narrower than that of filter 76. Filter 77 is used to obtain better rejection of the TD signal in the back up LO output channel. The output of filter 77 is amplified by amplifier 78, and serves as the back-up mode LO signal.

Fine step frequency control is not provided in the back-up mode of operation of the signal generator 50, but 100 MHz spaced channels over the 9.7 to 10.7 GHz region (11 channels) of the exemplary embodiment with full radar operational capability is maintained.

The detailed implementation of the means for detecting circuit or function failures is not an aspect of this disclosure and is not indicted in the block diagrams of FIG. 1 or FIG. 2. To provide insight into the overall operation of the disclosed exciter signal source, however, the following discussion reviews the basic philosophy and typical features of the failure detection functions. Failure detection circuits would typically be used to monitor one or more critical performance parameters on all primary output signal ports of the L-band frequency synthesizer 80, high band generator 70 and low band generator 60. In FIG. 1, these fault detectors would as a minimum monitor the power levels of the outputs of those functions as compared with thresholds representing minimum acceptable power levels for satisfactory operation and would also monitor the phase lock status of the high band generator 70, low band generator 60, and any phase locked loops used in the L-band frequency synthesizer 80. Upon the detection of a failure, the controller 96, which would also receive the fault detection status signals, would set switches 85, 90, and 92 to select an operating high or low band generator and send an output signal to the radar processor indicating the reconfiguration. The processor would then command an operating channel frequency within the back-up operating band.

The fault-tolerance feature will accommodate a circuit or function failure in the low band generator 60, in the high band generator 70, or in the L-band frequency synthesizer 80. Upon a failure detection, the output switches 90 and 92 would be set to derive the needed signals from the operating generator or from the generator of choice in the case of a synthesize failure. An estimated 90 percent of the critical exciter circuit function is backed up by the novel provisions of this signal generation technique. Additionally, the technique provides a potential 20 percent volume reduction over current narrow band and non-fault-tolerant techniques.

To further increase fault-tolerance for an actual application, the crystal reference oscillator, which provides a critical function but consists of a relatively small quantity of circuitry, could be simply backed up by providing a redundant oscillator.

Detailed Description of Low and High Band Generators

A more detailed block diagram of the architecture for the low and high band generators 60 and 70 is shown in FIG. 2. Except for provisions that were added to generate the back-up TD or first LO signal, the basic architecture of each generator is identical to that described in pending application Ser. No. 07/455,675.

The generator 100 of FIG. 2 comprises a harmonic phase locked loop that is closed around the harmonic phase comparator 116, loop compensation and error signal amplification network (H(s)) 118, summing node 120 for insertion of a phase lock acquisition control signal, microwave VCO 122, frequency offset mixer 130, coupler 131, bandpass filters 124 and 126. In the case of the low band generator 60, the "low band" phantom line connection is made from the mixer 130 output to the filter 126, with the function of filter 124 corresponding to that of filter 66 of FIG. 1, the function of filter 126 corresponding to that of filter 67. In the case of the high band generator 70, the "high band" phantom line connection is instead made from the filter 124 output to the filter 126, with the functions of the filters 124 and 126 then corresponding to the functions of filters 76 and 77.

The harmonic phase comparator 116 of generator 100 effectively compares the phase of the $K^{th}$ harmonic of the reference signal from the reference oscillator with the phase of the filtered feedback signal from the mixer 130 and generates an error voltage that is proportional to the phase difference. That phase difference is nominally zero when the loop is phase locked. Any departure from the zero error condition produces an error voltage that, after amplification and frequency weighting, is applied to the frequency control port of the VCO 122 to effect a correction of the phase error and maintain phase lock.

The periodic nature of the harmonic phase comparator 116 permits phase lock at any harmonic of the reference source signal that is within the frequency range of the elements that comprise the loop. For an exemplary implementation, that range covers the 57th through 79th harmonics for the low band generator and the 77th through 99th harmonics for the high band generator.

Phase lock acquisition to a selected harmonic lock ratio is provided by the frequency sweep and harmonic lock point counting scheme described in pending application Ser. No. 07/455,675. That phase lock acquisition process is briefly described here.

The phase lock acquisition control circuitry includes three principal elements, a voltage waveform generator that pretunes and slews the VCO frequency across the frequency range of the desired lock point, a frequency marking circuit that establishes a reference point in the microwave range of each generator, and a harmonic lock point detector and counter to identify and count the lock points as the frequency is swept away from the reference mark. The frequency marking function is provided by a narrow band microwave filter 102 and power detector 104 that is driven by a sample of the microwave feedback signal to the loop phase comparator 116 via coupler 106. The center frequency of the marker filter 102 is placed in the middle of the range of desired harmonic lock points and between two specific lock points.

During the phase lock acquisition process, a digital latch (108) is loaded with a number that corresponds to the number of harmonics that the desired lock point is separated from the frequency mark point. For phase lock to a frequency that is above the mark point, the acquisition waveform generator 110 pretunes the VCO (122) to a point that places the feedback signal frequency below the mark point. The waveform generator 110 then initiates a high speed upward frequency sweep of the VCO 122. When the mark point is encountered, a digital counter 112 is enabled to count the harmonic lock points as they are encountered and to compare that count with the number stored in the latch 108. The acquisition sweep is slowed at a point following the encounter with the last harmonic before the selected lock point and phase lock is allowed to occur.

Phase lock to the harmonic points that are adjacent to the frequency marker is accomplished with a high speed frequency sweep mode that is terminated when the marker frequency is encountered. The slower sweep is then used to slew the VCO frequency to the selected lock point.

Phase lock detection circuitry 114 confirms that phase lock has occurred and shuts down the phase lock acquisition circuitry. Following phase lock, that circuitry continues to monitor the phase lock status as a built-in-test (BIT) function and to reinitiate the acquisition process when necessary.

For phase lock to a point below the mark point, the acquisition waveform tunes the VCO 122 to a point above the mark point and the frequency is swept down to the lock point. Placing the mark point in the middle of the band substantially shortens the acquisition time since only half of the total band has to be swept. Maximum phase lock time to any of the 23 harmonics of the demonstration hardware is less than 40 microseconds, in one exemplary embodiment.

Fine step frequency control is provided by the L-band frequency synthesizer 80 as previously described with respect to FIG. 1. When phase locked, the generator 100 output frequency will equal the sum of the frequency of the feedback signal to the harmonic phase comparator ($K^{th}$ harmonic of the VHF reference) and the frequency of the synthesizer 80. Changing the synthesizer frequency in fine steps thereby produces a corresponding fine step change in the output frequency.

In the fault-tolerant, back-up mode of operation the frequency synthesizer input is replaced by a signal at a constant frequency equal to the receiver first IF. For the exemplary system embodiment described herein, that frequency is 20 times the 100 MHz reference or 2000 MHz. The harmonic phase-locked loops of the low and high band generators 60, 70 function as before to produce coarse, 100 MHz step, frequency control at the output, but without the frequency synthesizer 80, the fine step control is not provided.

With a signal of frequency equal to the first IF input supplied to the phase locked loop mixer 130, the mixer output frequency is offset from the primary loop output by the first IF. The mixer output signal can therefore function to replace the signal from a failed high or low band generator. For a low band generator failure, the high band generator would provide the TD signal from its main output and the receiver first LO from the mixer output. That output is coupled directly off of the signal path to the harmonic phase comparator. The bandpass filter 126 in the output path provides additional attenuation of transmitter drive leakage on the back-up LO signal path.

For a high band generator failure, the low band generator can similarly provide the first LO signal from its primary output and a back-up TD signal from the mixer output. In this case, the mixer upper sideband is used to provide the TD signal and the lower sideband is used as the feedback signal to the harmonic phase comparator 116. Separate filtering of the two mixer output signal paths provides attenuation of TD leakage and selection of the desired sidebands.

Figure 3:
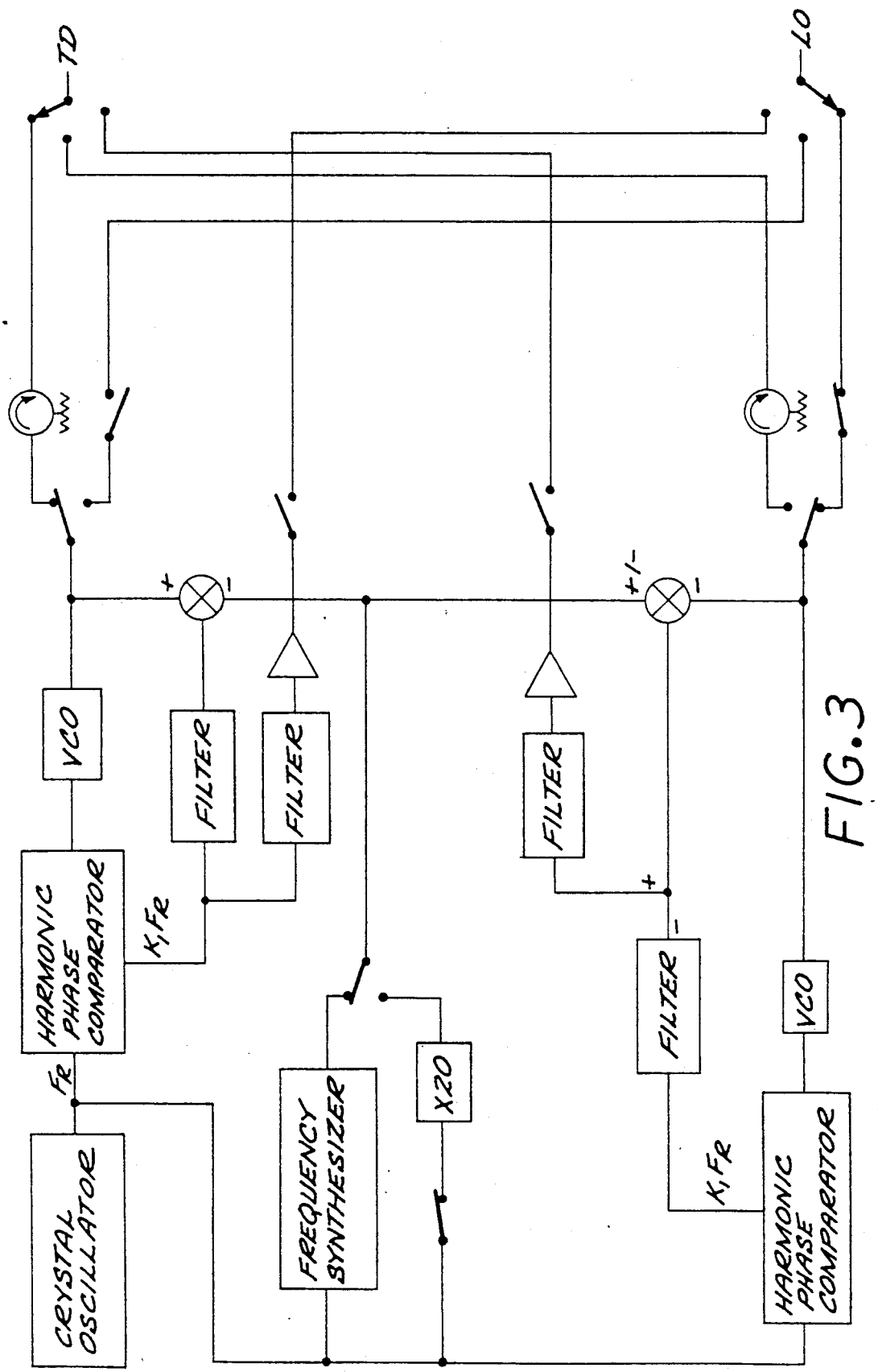
FIG. 3 is a simplified block diagram of a signal source similar to that of FIG. 1, but including additional switch and circulator elements to provide improved isolation.

It will be understood by those skilled in the art that the switch functions of switches 90 and 92 and the isolation between the high and low signal generators will typically be facilitated in a particular application by additional switches and microwave isolators not shown in FIG. 1. An exemplary such arrangement is shown in the simplified block diagram of FIG. 3.

Key Features of the Fault-Tolerant Signal Source

1. An architecture that allows all frequency referencing to a single reference oscillator to provide optimum control of spurious signal generation. All spurious frequencies fall either coincident with the carrier and can be ignored or at offsets from the carrier equal to integer multiples of the maximum common frequency term used in the frequency synthesis plan. For the exemplary generator described above, that common frequency is equal to the fine frequency control increment 12.5 MHz, which is beyond the critical region close to the carrier.

2. An architecture that provides separate generation of the TD and first LO signals to facilitate the attainment of wide band, low spurious level operation. The separation of these functions allow their individual optimization and minimizes the opportunity for leakage of the TD signal onto the first LO output; a critical radar concern. Frequency upconverter approaches that derive the TD from the LO are generally limited to less than 10 percent bandwidth operation from spurious signal considerations. The operating bandwidth of the disclosed approach can be exceptionally wide, limited only by the bandwidth that can be provided by individual circuit elements.

3. Extensive fault-tolerance is inherently provided with very little additional hardware. Although fewer channels are available in the failure back-up mode, those channels will continue to provide full radar quality performance in terms of noise and spurious content, frequency switching speed, and radar modulations.

4. Despite the greatly increased performance capability and the provision of fault-tolerance, the projected packaging volume is 20 percent less than the corresponding functions in current radar exciters. That savings is possible because of the functional integration of the frequency synthesis provisions that the disclosed architecture provides.

It is understood that the above-described embodiments are merely illustrative of the possible specific embodiments which may represent principles of the present invention. Other arrangements may readily be devised in accordance with these principles by those skilled in the art without departing from the scope and spirit of the invention. Thus, the particular reference frequency, operating band, operating bandwidth, channel frequency spacing, the multiplication factor of the frequency multiplier 84, and operating band for fault operation that are given for the example implementation that is described here are given only as a means of providing a clearer description of the invention. Other implementations may utilize the basic architecture of this invention but with different frequency plans.

What is claimed is:

1. A wide-band microwave signal generator for active radars, characterized in that separate transmit drive (TD) and receiver local oscillator (LO) signals are separately generated from a single reference oscillator, comprising:

a stable reference oscillator for generating a reference signal at a reference frequency;

a low band frequency generator responsive to the reference signal for synthesizing a first low band output signal which is programmable over a first low frequency band comprising a wide frequency band of operation;

a high band frequency generator responsive to the reference signal for synthesizing a first high band output signal which is programmable over a first relatively high frequency band comprising said wide frequency band;

TD selection means for selecting said first low band generator output signal or said first high band output signal as the radar TD signal; and LO selection means for selecting said first low band generator output signal or said first high band generator output signal as said receiver LO signal, such that said first low band generator output signal is selected as said LO signal when said first high band generator output signal is selected as the TD signal, and said first high band generator output signal is selected as said LO signal when said first low band generator output signal is selected as the TD signal.

2. The signal generator of claim wherein said transmitter drive selection means comprises a first microwave switch for selecting one of said generator output signals as said radar TD signal.

3. The signal generator of claim 1 wherein said LO selection means comprises a second microwave switch for selecting one of said generator output signals as said receiver LO signal.

4. The signal generator of claim 1 wherein said low frequency and said high frequency bands are substantially contiguous bands which together cover said wide frequency band.

5. The signal generator of claim 1 wherein said low band frequency generator comprises a programmable harmonic phase lock loop (PLL) responsive to said reference signal, said loop being closed around a harmonic phase comparator, a voltage controlled oscillator (VCO) and an offset signal mixer for mixing the VCO signal with a an offset signal, the output of the mixer comprising a microwave signal fed back to the harmonic phase comparator for comparison with the reference signal, wherein the PLL may be programmably locked to an offset from a harmonic of the reference signal, the offset being determined by said offset signal.

6. The signal generator of claim 5 further comprising a frequency synthesizer for synthesizing said fine frequency control offset signal from said reference signal.

7. The signal generator of claim 1 wherein said high band frequency generator comprises a programmable harmonic phase lock loop (PLL) responsive to said reference signal, said loop being closed around a harmonic phase comparator, a voltage controlled oscillator (VCO) and an offset signal mixer for mixing the VCO signal with an offset signal, the output of the mixer comprising a microwave signal fed back to the harmonic phase comparator for comparison with the reference signal, wherein the PLL may be programmably locked to an offset from a harmonic of the reference signal, the offset being determined by said offset signal.

8. The signal generator of claim 7 further comprising a frequency synthesizer for synthesizing said fine frequency control offset signal from said reference signal.

9. A fault-tolerant microwave signal generator for active radars having a radar transmitter and a radar receiver characterized by a receiver local oscillator (LO) signal and a receiver first intermediate frequency (IF), the signal generator comprising:
   a reference signal generator for generating a reference signal at a reference frequency;
   a programmable frequency synthesizer responsive to said reference signal for synthesizing a first frequency offset signal;
   a frequency multiplier responsive to said reference signal for generating a second frequency offset signal at said first receiver IF;
   a programmable harmonic phase lock loop (PLL), said loop being closed around a harmonic phase comparator, a voltage controlled oscillator (VCO) and an offset signal mixer for mixing the output of the VCO with said frequency offset signal, and wherein a first generator output is taken from said VCO output, said output being an offset from a programmable harmonic of said reference signal, and a second generator output being taken from said mixer;
   means for selecting either said first or second frequency offset signal to be mixed with said VCO output at said mixer, said first offset signal being selected during a primary mode of operation, said second offset signal being selected during a back-up mode of operation, thereby providing fault tolerance in the event of a synthesizer or a first or second generator output signal fault;
   said first generator output signal can act as one of said TD or LO signals, and during said back-up mode of operation, said first and second generator outputs can be used as said TD and LO signals.

10. The signal generator of claim 9 wherein said frequency synthesizer comprises means for programmably selecting the synthesized signal frequency, thereby providing fine frequency offset control of the frequency of said first output signal of said generator during said primary mode of operation.

11. The generator of claim 9 further comprising means for filtering said output of said mixer to obtain a desired sideband of said mixer output as said second output signal.

12. The generator of claim 9 wherein said selecting means comprises a microwave switch for selectively coupling either said synthesizer signal or said multiplier signal to said offset mixer.

13. A wide band signal generator for generating separate transmit drive (TD) and receiver local oscillator (LO) signals from a single reference signal for a radar system comprising a radar transmitter and a radar receiver, comprising:
   a stable reference oscillator for generating a reference signal at a reference frequency;
   a low band generator responsive to the reference signal for synthesizing a first low band generator output signal which is programmable over a first low frequency band comprising a wide frequency band of operation;
   a high band generator responsive to said reference signal for synthesizing a first high band generator output signal which is programmable over a first relatively high frequency band comprising said wide frequency band;
   means for maintaining a fixed frequency offset between said first low band output signal and said first high band output signal;
   TD selection means for selecting either said first low band output signal or said first high band output signal as the radar TD signal;
   LO selection means for selecting either said first low band output signal or said first high band output signal as the receiver LO signal;
   control means for controlling said respective selection means so that when said low band output signal is selected as the TD signal for operation over said low band of operation, said first high band output signal then being selected as said LO signal, and when said high band output is selected as the TD signal for operation over said high band of operation, said first low band output signal is selected as said LO signal; and
   means for accommodating the receive signal spectrum inversion produced by switching the signal about the LO.

14. The signal generator of claim 13 wherein said receiver is characterized by a receiver first intermediate frequency (IF), and wherein said fixed frequency offset is equal to said first IF.

15. The signal generator of claim 13 wherein said low band generator comprises a first programmable harmonic phase locked loop, wherein the particular harmonic of said reference signal to which the PLL is locked is programmable, and said high band generator comprises a second programmable harmonic phase locked loop, wherein the particular harmonic of the reference signal to which the second PLL is locked is programmable, and said means for maintaining a fixed frequency offset comprises means for maintaining a constant difference in the programmed harmonic lock ratios of the low and high signal generators.

16. A fault tolerant, wide band microwave signal generator for generating separate transmit drive (TD) and receiver local oscillator (LO) signals from a single reference signal for a radar system including a transmitter and a receiver characterized by a first receiver intermediate frequency (IF), comprising:
   a stable reference oscillator for generating a reference signal at a reference frequency;
   a programmable frequency synthesizer responsive to said reference signal for synthesizing a programmable first frequency offset signal;

a frequency multiplier responsive to said reference signal for generating a second frequency offset signal whose frequency is that of said first receiver IF;

a programmable low band frequency generator responsive to said reference signal for synthesizing a first low band output signal which is programmable over a first low frequency band comprising a wide frequency band of operation of said signal generator during a primary mode of operation, said low band generator comprising a first harmonic phase lock loop (PLL) closed around a first harmonic phase comparator, a first voltage controlled oscillator (VCO), and an offset signal mixer for mixing the output of said first VCO with one of said offset signals, and wherein a first generator output signal is taken from said VCO output, said output being an offset from a programmable harmonic of said reference signal, and a second low band generator output signal being taken from said mixer output;

a programmable high band frequency generator responsive to said reference signal for synthesizing a first high band output signal which is programmable over a first high frequency band comprising said wide frequency band during said primary mode of operation, said high band generator comprising a second harmonic PLL closed around a second harmonic phase comparator, a second VCO, and a second offset signal mixer for mixing the output of said second VCO with one of said offset signals, and wherein said first high band output signal is taken from said second VCO output, said output being an offset from a programmable harmonic of said reference signal, and a second high band generator output signal being taken from said second mixer output;

TD selection means for selecting as the TD drive signal one of said first high band generator, said first low band generator or said second low band generator signals;

LO selection means for selecting as the LO signal one of said first high band generator, said first low band generator or said second high band generator signals; and offset signal selector means for selecting said first frequency offset signal as said mixer offset signal during said primary mode of operation, or for selecting said second frequency offset signal as said mixer offset signal during a back up mode of operation.

* * * * *